(12) United States Patent
Ide et al.

(10) Patent No.: US 8,633,593 B2
(45) Date of Patent: Jan. 21, 2014

(54) SEMICONDUCTOR DEVICE

(75) Inventors: Akira Ide, Tokyo (JP); Koji Torii, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/427,758

(22) Filed: Mar. 22, 2012

(65) Prior Publication Data

US 2012/0241917 A1    Sep. 27, 2012

(30) Foreign Application Priority Data

Mar. 25, 2011    (JP) ................................ P2011-067968

(51) Int. Cl.
*H01L 21/469* (2006.01)

(52) U.S. Cl.
USPC ............ 257/773; 257/750; 257/785; 257/786

(58) Field of Classification Search
USPC ......... 257/686, 690, 697, 700, 777, 784–786, 257/750, 761, 758; 438/618–624, 106–108, 438/672–673, 700
See application file for complete search history.

(56) References Cited

U.S. PATENT DOCUMENTS

| | | | | |
|---|---|---|---|---|
| 8,278,421 | B2 * | 10/2012 | Masat et al. ............... | 530/387.1 |
| 8,298,917 | B2 * | 10/2012 | Andry et al. ................. | 438/462 |
| 2006/0103025 | A1 | 5/2006 | Furusawa et al. | |
| 2011/0127631 | A1 * | 6/2011 | Kawashima .................. | 257/466 |
| 2011/0233785 | A1 * | 9/2011 | Koester et al. ................ | 257/773 |
| 2012/0001337 | A1 * | 1/2012 | Tsai et al. ..................... | 257/770 |

FOREIGN PATENT DOCUMENTS

JP    2006-140404 A    6/2006

* cited by examiner

*Primary Examiner* — Dung A. Le
(74) *Attorney, Agent, or Firm* — McGinn IP Law Group, PLLC

(57) ABSTRACT

A semiconductor device includes a semiconductor substrate; and a through electrode that penetrates the semiconductor substrate. The semiconductor substrate has a groove structure that is positioned between a peripheral edge of the semiconductor substrate and the through electrode.

20 Claims, 14 Drawing Sheets

SEMICONDUCTOR DEVICE

BACKGROUND OF THE INVENTION

1. Field of the Invention

The present mention relates to a semiconductor chip, a method for manufacturing a semiconductor chip, and a semiconductor device.

Priority is claimed on Japanese Patent Application No. 2011-067968, filed Mar. 25, 2011, the content of which is incorporated herein by reference.

2. Description of the Related Art

With an increase in the level of integration of semiconductor chips in recent years, there have been accompanying advances, with increasing chip sizes and advances in nanoscaling and multi-leveling of nte connects. In order to achieve a higher packaging density, it has become necessary to reduce the package size and thickness.

To accommodate such demands, art regarding MCPs (multichip packages), in which a plurality of semiconductor chips are mounted with high density onto a single interconnect substrate has been developed. In this art, a CoC (chip-on-chip) type of semiconductor package (semiconductor device), in which a chip stack of semiconductor chips having through electrodes known as TSVs (through silicon vias) is mounted onto one surface of an interconnect substrate, has gained attention.

The semiconductor chip having the above-described through electrodes as well are made into separate chips by fabrication of the plurality thereof onto one wafer and then dicing the wafer. In this dicing process step, there are cases in which chipping occurs at the front surface side and the rear surface side of the chip. Measures are often taken with respect to chipping on the front surface side, and if there are no through electrodes, no chipping occurs on the rear surface side. However, with regard to a semiconductor chip having through electrodes, chipping on the rear surface side reaches the region in which the through electrodes are formed.

Japanese Patent Application Publication No. JPA 2006-140404 discloses a trench on the front surface side of the semiconductor chip for the purpose of preventing peeling. The publication has no disclosure, teaching, or suggestion with regard to the through electrodes, and also no disclosure, teaching, or suggestion regarding measures regarding chipping on the rear surface side.

SUMMARY

In one embodiment, a semiconductor device may include, but is not limited to, a semiconductor substrate; and a through electrode that penetrates the semiconductor substrate. The semiconductor substrate has a groove structure that is positioned between a peripheral edge of the semiconductor substrate and the through electrode.

In another embodiment, a semiconductor device may include, but is not limited to, a wiring board; and a plurality of semiconductor chips stacked over the wiring board. Each of the plurality of semiconductor chips includes a semiconductor substrate having first and second surfaces opposing to each other; an inter-layer insulator on the first surface of the semiconductor substrate; a plurality of interconnects in the inter-layer insulator; and a plurality of through electrodes that penetrate the semiconductor substrate, the through electrode coupled to the plurality of interconnects, respectively. The semiconductor substrate has a groove structure in the second surface. The groove structure is positioned between a peripheral edge of the semiconductor substrate and the plurality of through electrodes.

In another embodiment, a semiconductor device may include, but is not limited to, a semiconductor substrate including first and second surface portions opposing to each other; a plurality of through electrodes each penetrating the semiconductor substrate: a plurality of circuit elements formed in the first surface portion; and a groove formed in the second surface portion without penetrating the semiconductor substrate.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Figure 1:
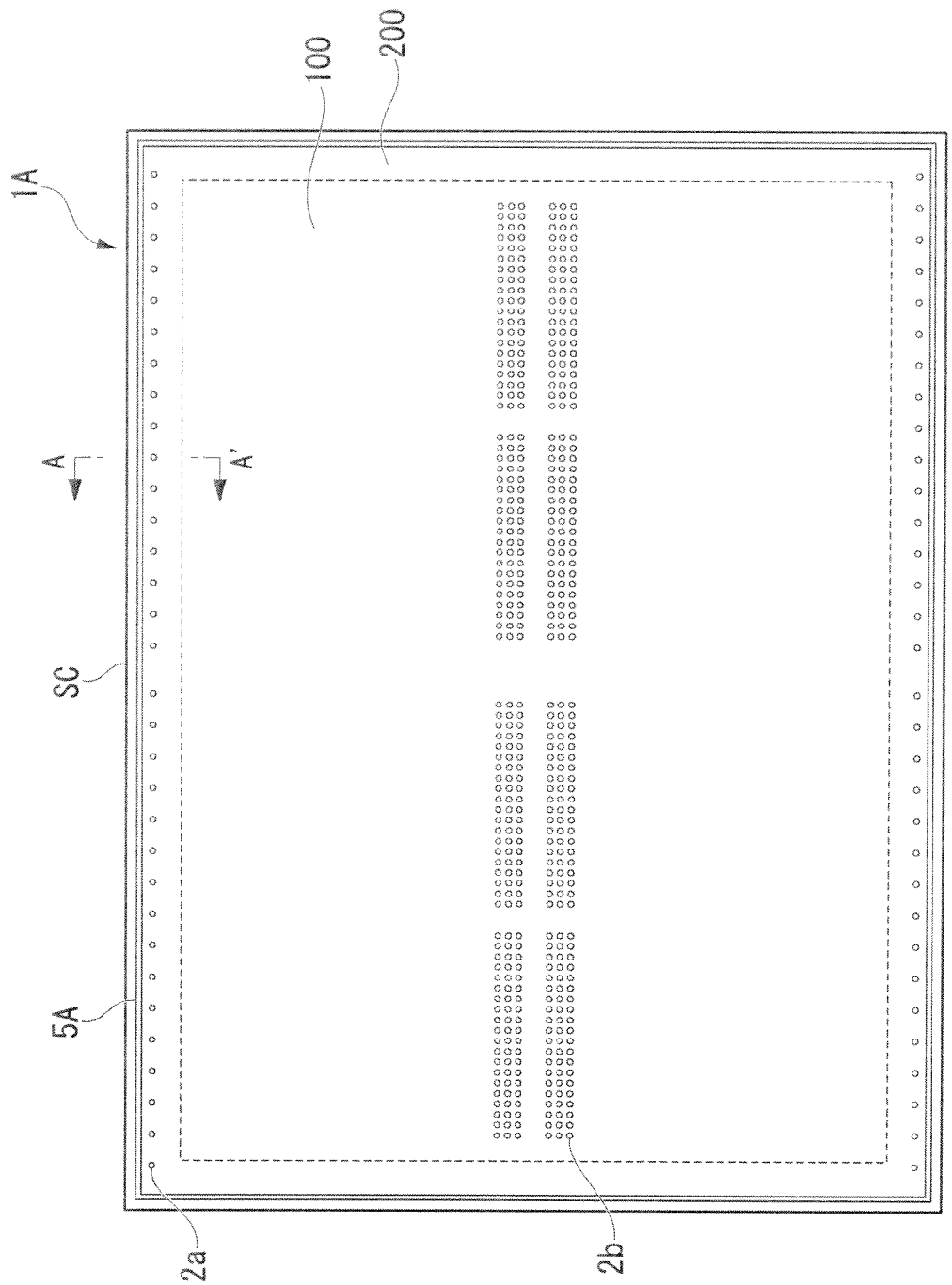
FIG. 1 is a plan view of a memory chip in accordance with a first embodiment of the present invention.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a semiconductor device may include, but is not limited to, a semiconductor substrate; and a through electrode that penetrates the semiconductor substrate. The semiconductor substrate has a groove structure that is positioned between a peripheral edge of the semiconductor substrate and the through electrode. In some cases, the semiconductor device may further include, but is not limited to, an inter-Layer insulator mounted on a first surface of the semiconductor substrate; and a multi-level interconnect structure provided in the inter-layer insulator, the multi-level interconnect structure including first and second interconnects and a first contact plug coupling the first interconnect to the second interconnect. The groove structure is formed in a second surface opposing to the first surface of the semiconductor substrate and an end of the through electrode being coupled to the first interconnect.

In some cases, the semiconductor device may further include, but is not limited to, a first electrode provided on the multi-level interconnect structure. The multi-level interconnect structure further includes a third interconnect which is electrically connected to the second interconnect, and the first electrode is coupled to the third interconnect.

In some cases, the semiconductor device may further include, but is not limited to, a second electrode mounted on the second surface of the semiconductor substrate, the second electrode being coupled to the other end of the through electrode so that the first electrode is electrically connected to the second electrode through the multi-level interconnect structure and the through electrode.

In some cases, the semiconductor substrate has at least an alignment mark, and the groove structure is positioned between the alignment mark and the peripheral edge of the semiconductor substrate.

In some cases, the groove structure does not penetrate the semiconductor substrate.

In some cases, the semiconductor device may further include, but is not limited to, a guard ring structure provided in the inter-layer insulator, the guard ring structure including third and fourth interconnects and a second contact plug coupling to the third interconnect to the fourth interconnect. The guard ring is located between the multi-level interconnect structure and a peripheral edge of the inter-layer insulator. The peripheral edge of the inter-layer insulator is approximately vertically aligned with the peripheral edge of the semiconductor substrate.

In some cases, the guard ring structure at east partially overlaps the groove structure in plan view.

In some cases, the semiconductor device may further include, but is not limited to, a crack stopper structure provided in the inter-layer insulator, the crack stopper structure including fifth and sixth interconnects and a third contact plug coupling to the fifth interconnect to the sixth interconnects, the crack stopper being located between the guard ring structure and the peripheral edge of the inter-layer insulator.

In another embodiment, a semiconductor device may include, but is not limited to, a wiring board; and a plurality of semiconductor chips stacked over the wiring board. Each of the plurality of semiconductor chips includes a semiconductor substrate having first and second surfaces opposing to each other; an inter-layer insulator on the first surface of the semiconductor substrate; a plurality of interconnects in the inter-layer insulator; and a plurality of through electrodes that penetrate the semiconductor substrate, the through electrode coupled to the plurality of interconnects, respectively. The semiconductor substrate has a groove structure in the second surface. The groove structure is positioned between a peripheral edge of the semiconductor substrate and the plurality of through electrodes.

In some cases, each of the semiconductor chips may further includes, but is not limited to, a crack stopper structure in a crack stopper area of the inter-layer insulator, and a guard ring structure in a guard ring area of the inter-layer insulator. The crack stopper area is defined between the groove structure and the peripheral edge of the substrate structure. The guard ring area is defined between the crack stopper area and an active area. The active area has the plurality of through electrodes. The groove structure is disposed in the second surface and in the guard ring area.

In another embodiment, a semiconductor device may include, but is not limited to a semiconductor substrate including first and second surface portions opposing to each other; a plurality of through electrodes each penetrating the semiconductor substrate; a plurality of circuit elements formed in the first surface portion; and a groove formed in the second surface portion without penetrating the semiconductor substrate.

In some cases, the semiconductor substrate includes a central portion and a peripheral portion surrounding the central portion. The central portion is defined by central areas of the first and second surface portions. The groove of the semiconductor substrate is included in the peripheral portion. The through electrodes and the circuit elements are included in the central portion.

In some cases, the semiconductor substrate further includes a plurality of side surface portions. The groove is formed along the side surface portions and surrounding the central portion.

In some cases, the semiconductor device may further include, but is not limited to, a plurality of additional grooves each formed in the second surface portion without penetrating the semiconductor substrate, the additional grooves being included in the peripheral portion.

In some cases, the semiconductor device may further include, but is not limited to, a plurality of additional through electrodes each penetrating the semiconductor substrate. The additional through electrodes is included in the peripheral portion. The semiconductor substrate further includes a plurality of side surface portions. The groove is located between one of the side surface portions and at least one of the additional through electrodes.

In some cases, the semiconductor substrate may further include a plurality of side surface portions. The groove is located between one of the side surface portions and at least one of the through electrodes.

In some cases, the groove is formed along the one of the side surface portions. The additional through electrodes are arranged along the one of the side surface portions.

In some cases, the additional through electrodes are configured to have a common potential and each of the through electrodes are electrically connected to a corresponding one of the circuit elements.

In some cases, a depth of the groove is less than half of a thickness of the semiconductor substrate.

According to a semiconductor chip of the present invention, chipping on the rear surface side that can occur in the process step of dicing from a wafer can be prevented from intruding into an active area of the semiconductor chip.

Accompanying the above, the yield at an outer appearance inspection of the rear surface after dicing is improved.

Additionally, a reduction of the scribing area of the semiconductor chip becomes possible, making it possible to reduce the overall chip size and, as a result, enabling an increase in the effective number of chips obtained per wafer.

EMBODIMENTS

Embodiments of the present invention will be described below in detail, with references made to the drawings.

First Embodiment

Figure 2:
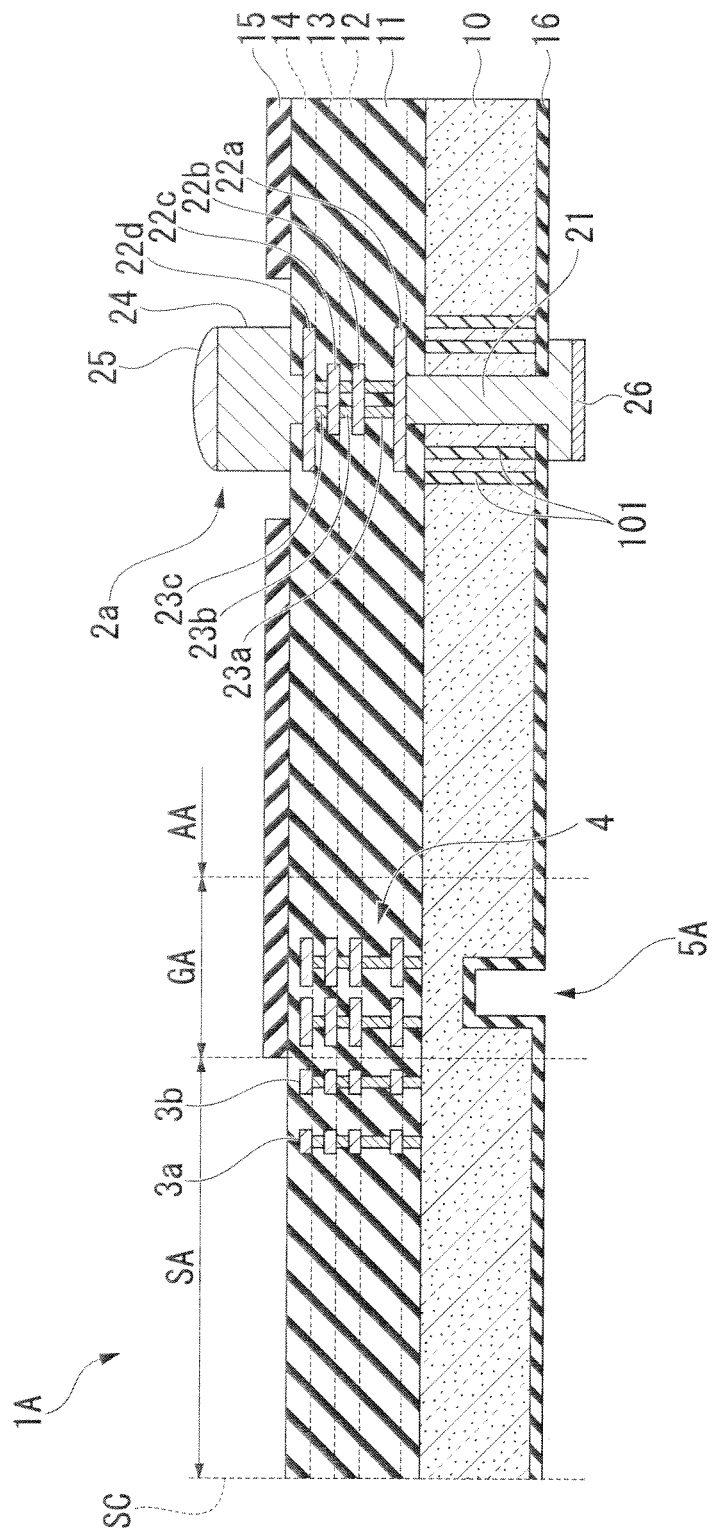
FIG. 2 is a fragmentary cross sectional elevation view of the memory chip, taken along an A-A' line of FIG. 1.

FIG. 1 is a schematic plan view representation of a memory chip (DRAM) according to a first embodiment in a semiconductor chip of the present invention, seen the rear surface side. FIG. 2 is a cross-sectional view along the line A-A' of FIG. 1.

The memory chip 1A includes a central portion 100 and a peripheral portion 200 which surrounds the central portion 100. The rear surface side of the memory chip 1A shown in FIG. 1 is provided with a plurality of through electrodes (first through electrodes) 2b for the purpose of sending signals, a power supply, and the like during normal operation, these being provided in the center region thereof, along the longitudinal direction. Support through electrodes 2a (second through electrodes) are provided in at peripheral edge of the chip, rear surface bump electrodes connected to these support through electrodes 2a being used as support bumps for the purpose of establishing spacing between chips when chips are stacked. During normal operation, the support through electrodes 2a are floating or are at the power supply or ground level.

Additionally, a rear surface chipping-prevention groove 5A is provided between the peripheral edge of the rear surface of the chip and the support through electrodes 2a. By this rear surface chipping-prevention groove 5A, it is possible to prevent chipping from intruding into regions in which the support through electrodes 2a and the through electrodes 2b for signals and the like are formed.

In FIG. 2, the memory chip 1A has a semiconductor substrate 10, first, second, third, and fourth interlayer insulating films 11, 12, 13, and 14 laminated onto the front surface thereof, a polyimide (PI) film (passivation film) 15 laminated over the fourth interlayer insulating film 14, and a passivation film 16 laminated over the rear surface of the semiconductor substrate 10.

The memory chip 1A is partitioned from the scribe center SC side, which will be described later, into a scribing area SA, a guard ring area GA, and an active area AA.

Support through electrodes 2a are provided in aperture parts of the PI film 15 of the active area AA. A support through electrode 2a has a through hole part (TSV: through silicon via) 21 that passes through the semiconductor substrate 10, interconnects 22a to 22d that are separated by the first, second, third, and fourth interlayer insulating films 11, 12, 13, and 14, contact plugs 23a to 23c that are vertically connected to the interconnects 22a to 22d, a pillar part 24 exposed from the aperture part of the PI film 15, a front surface bump electrode 25 provide on the upper surface of the pillar part 24, and a rear surface bump electrode 26 provided on a part of the through hole part 21 that is exposed on the rear surface of the semiconductor substrate 10. Circuit elements are formed on the upper surface of the memory chip 1A and in the active area AA which can also be referred to as a center portion of the memory chip 1A. The circuit elements are each connected to respective ones of the through electrodes 2B.

A trench isolation (TI) 101 is provided in the vicinity of the through hole part 21 of the semiconductor substrate 10.

First and second crack stops 3a, 3b for preventing chipping of the front surface side of the memory chip 1A are provided within the interlayer insulating films in the scribing region SA.

A guard ring (seal ring) 4 is provided on the front surface side of the guard ring area GA. The guard ring 4 serves to prevent the intrusion of moisture and the like. On the semiconductor substrate 10 side of the guard ring area GA, that is, on the rear surface side of the memory chip 1A, a groove 5A for preventing chipping on the rear surface side is provided.

Figure 3:
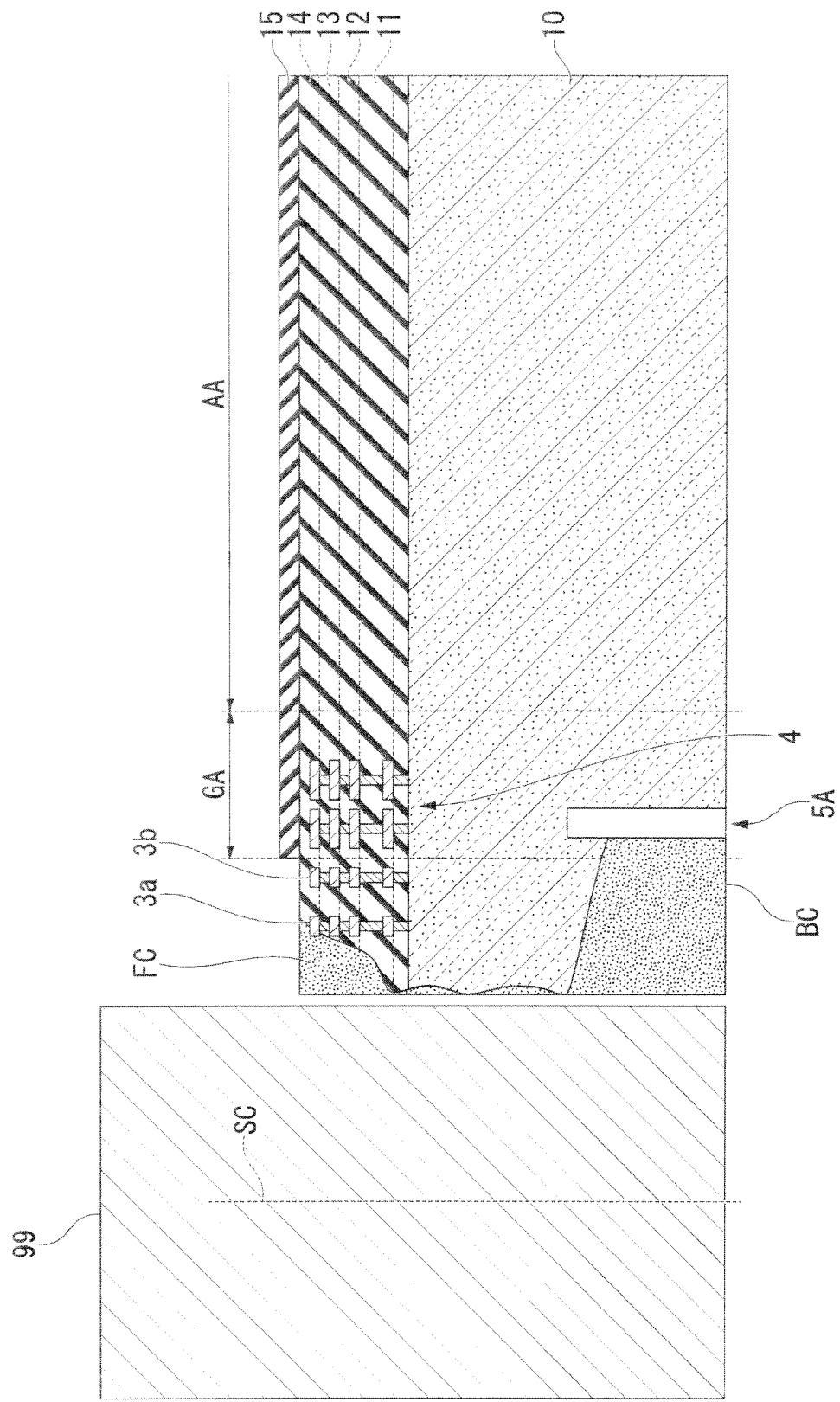
FIG. 3 is a fragmentary cross sectional elevation view of the memory chip with a groove for preventing chipping from intruding into the active area.

FIG. 3 is a cross-sectional view showing the condition in which the rear surface chipping-preventing groove 5A prevents chipping from intruding into the active area AA.

In FIG. 3, when dicing is done along the scribe center SC using a dicing blade 99, although there is a risk that front surface chipping FC and rear surface chipping BC will occur, the intrusion of front surface chipping FC is prevented by the first and second crack stops 3a, 3b and the intrusion of rear surface chipping BC is prevented by the rear surface chipping-prevention groove 5A. Because the rear surface chipping BC is wedge shaped, the rear surface chipping-prevention groove 5A provided in the guard ring area GA need not be formed as deep as the through hole part 21. In some cases, the groove may have a depth which is less than a half of the thickness of the semiconductor substrate. Also, because FIG. 3 is a further enlarged view of FIG. 2, illustrations of the support through electrodes 2a are omitted.

Figure 4:
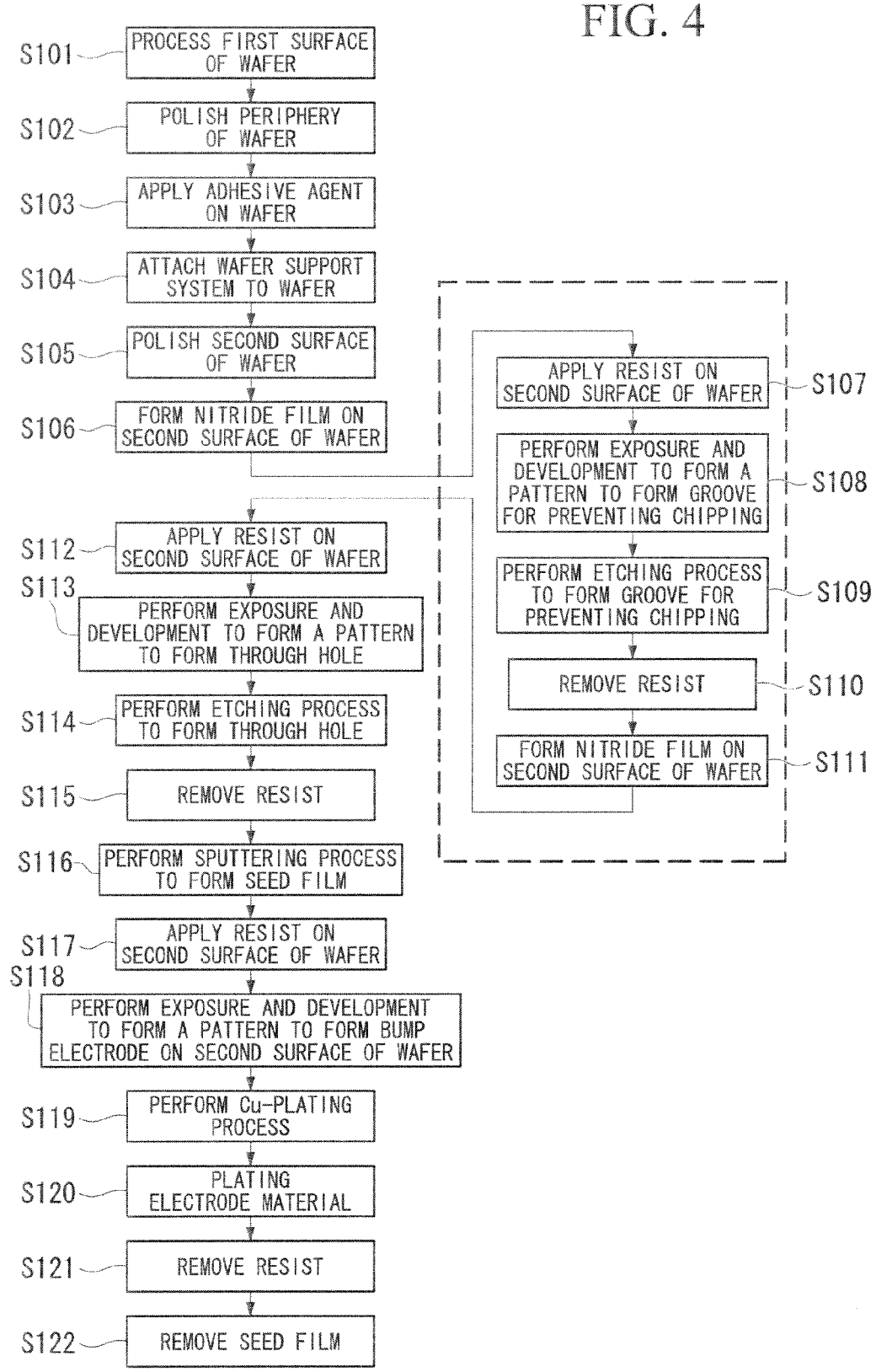
FIG. 4 is a flaw chart of a process for manufacturing the semiconductor device of FIGS. 1 and 2.

The method of manufacturing the memory chip 1A of the first embodiment shown in FIG. 1 and FIG. 2 will be described. FIG. 4 is a flowchart showing the procedure for manufacturing the memory chip 1A according to the first embodiment. All of the process steps shown as steps in FIG. 4 are performed on a wafer 100. Additionally, the manufacturing procedure shown in FIG. 4 shows the procedure after the completion of the interconnect process step up to the formation of the front surface bump electrodes.

The surface of the wafer 100 is processed (S101) and the outer periphery thereof is polished (S102). Next, an adhesive is applied to the surface (S103), and a carrier (WSS: wafer support system) formed from $SiO_2$ or the like is adhered (S104). An adhesive that can be peeled from the wafer using ultraviolet light is used as the adhesive. The rear surface is polished down to approximately 50 to 20 µm (S105), and a nitride film of $Si_3N_4$ or the like is grown for the purpose of preventing metal contamination (S106).

By going through the process steps of applying photoresist to the rear surface (S107), exposing and developing the pattern for the rear surface chipping-prevention groove 5A (S108), and performing shallow-trench etching (S109), the rear surface chipping-prevention groove 5A is formed. Then, the photoresist that was applied at step S107 is removed (S110) and a nitride film is again grown (S111).

By going through the process steps of photoresist application (S114, exposing and developing the pattern for the through holes of the through electrodes 2a, 2b (S113), and performing through hole etching (S114), the through hole parts 21 are formed. Then, the photoresist that was applied at S112 is removed (S115) and a seed film of Ti/Cu or the like is formed by sputtering or the like (S116).

To form the rear surface bump electrodes 26, after application of photoresist (S117) and exposure and development (S118), copper (Cu) is plated to fill the through hole parts 21 (S119).

An electrode material (for example, SnAg) is plated as the rear surface bump electrodes 26 (S120). Finally, the photoresist that was applied at step S117 is removed (S121), and the seed film formed by sputtering at step S116 is removed by wet etching or the like (S122). Finally, although it is not illustrated, demounting is done from the carrier, using ultraviolet light or the like.

Figure 5:
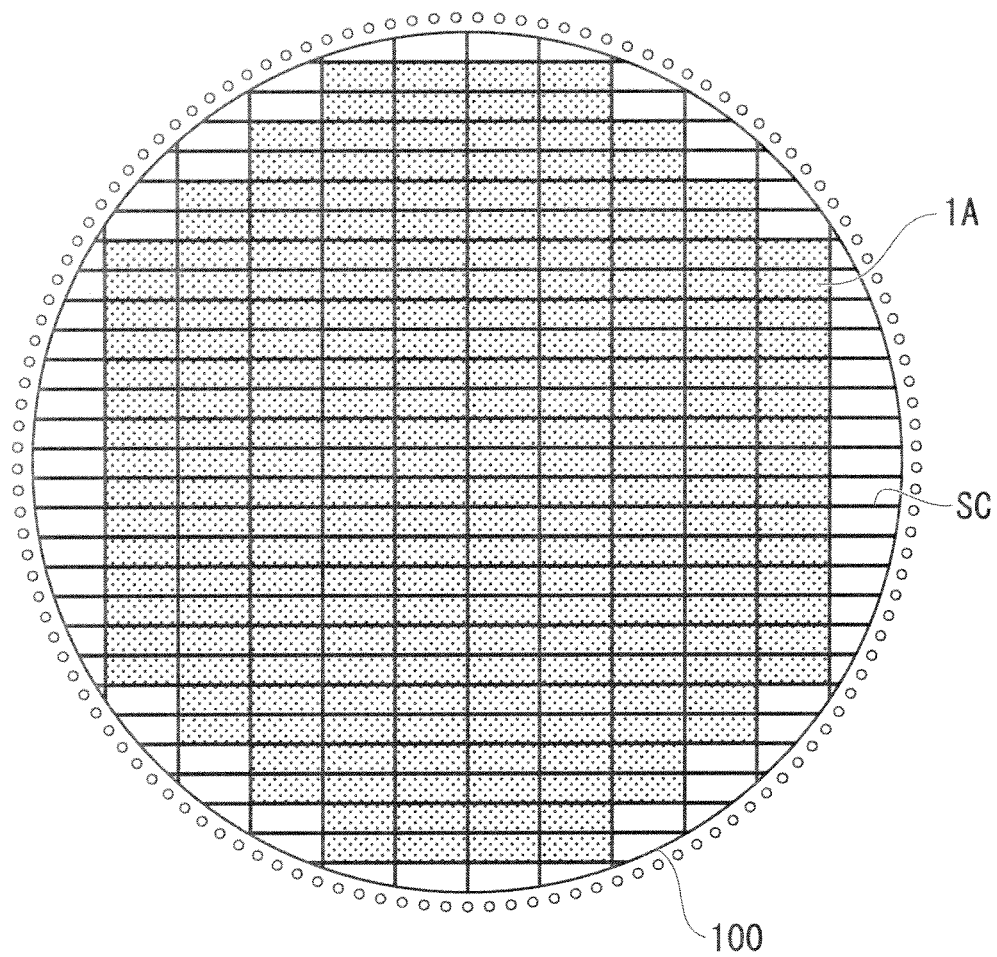
FIG. 5 is a plan view of a semiconductor wafer.

Going through the above-described process steps, the wafer 100 that includes a plurality of memory chips 1A is completed, as shown in FIG. 5. After that, by dicing into individual chips along the scribe centers SC, each of a plurality of memory chips 1A is completed.

Figure 6:
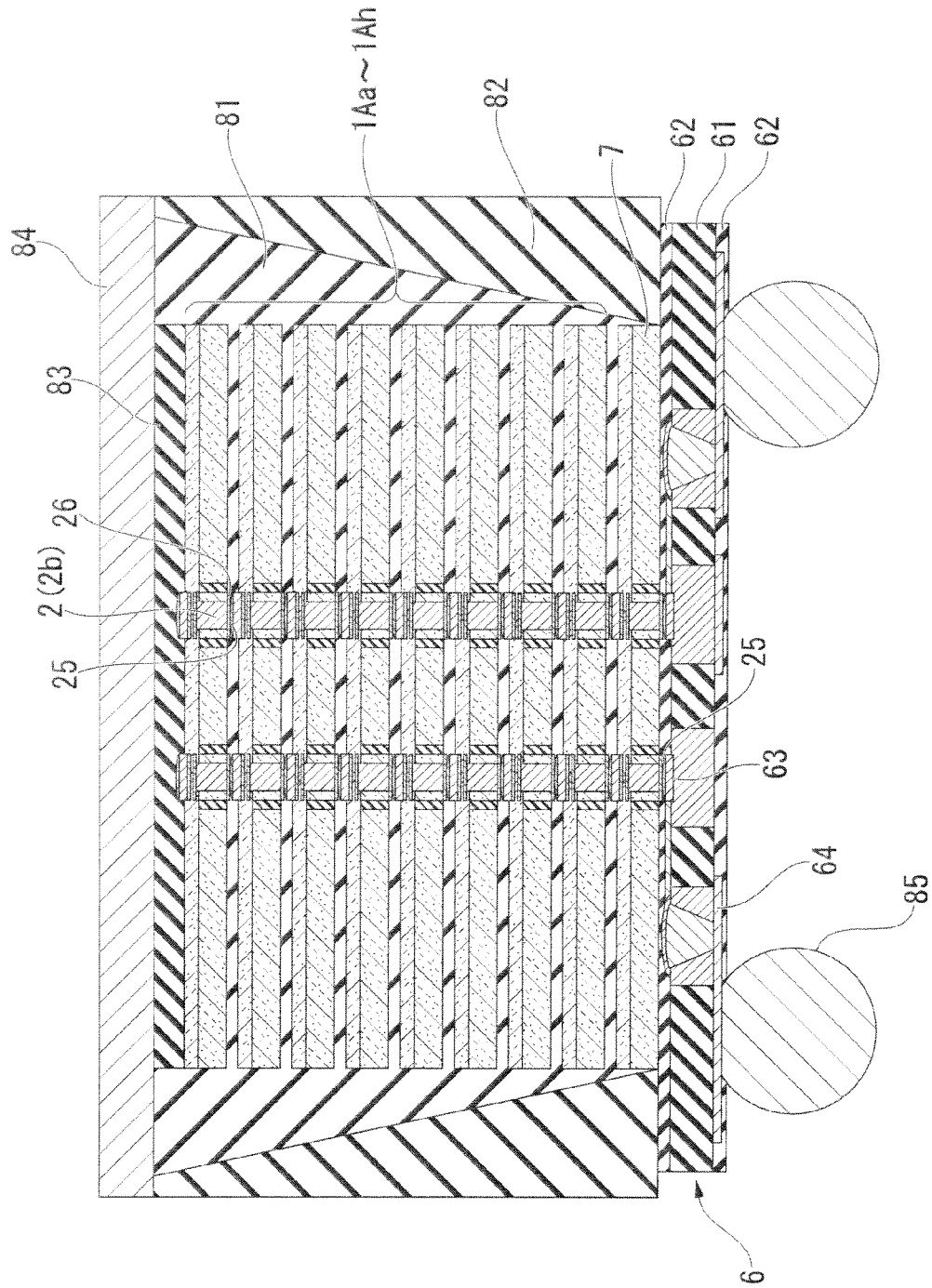
FIG. 6 is a chip-on-chip semiconductor package.

A CoC (chip-on-chip) type of semiconductor package (semiconductor device), in which a chip laminate formed by the lamination of memory chips 1A fabricated as described above is mounted to one surface of an interconnect substrate, will be described, with reference made to FIG. 6.

The semiconductor package has an interconnect substrate 6 that is substantially rectangular and that has formed thereon prescribed interconnects. The interconnect substrate 6 is, for example, a fiberglass epoxy resin substrate having a thickness of 0.2 mm, on which prescribed interconnects are formed on both surfaces of an insulating base material 61, the interconnects being partial covered by an insulating film 62 of, for example, solder resist. Aperture parts are formed in the center region of one surface of the interconnect substrate 6, and in positions exposed from the aperture parts of the insulating film 62, a plurality of connection pads 63 are formed. At positions exposed from the insulating film 62 of the interconnects on the other surface of the interconnect substrate 6, a plurality of lands 64 are formed. In this case, the connection pads 63 and the corresponding lands 64 are respectively connected electrically by the interconnects of the interconnect substrate 6.

A chip laminate is mounted to one surface of the interconnect substrate 6. The chip laminate is constituted, for example, by a plurality of laminated semiconductor chips that are substantially rectangular and sheet-shaped, and on one surface of which prescribed circuits are formed. The semiconductor package shown in FIG. 6, for example, has eight memory chips 1Aa to 1Ah, onto which memory circuits are formed, and an interface chip 7 for the purpose of interfacing between the memory chips 1A and the interconnect substrate 6, these forming a nine-layer laminate. Each of the semiconductor chips is constituted, for example, to have a thickness of 50 μm and, as described above, has formed thereon a plurality of front surface bump electrodes 25 and a plurality of rear surface bump electrodes 26 in the center region of the other surface side thereof. The front surface bump electrodes 25 and the rear surface bump electrodes 26 corresponding thereto are electrically connected by the through electrodes 2. Although the description based on FIG. 1 to FIG. 5 was for a memory chip 1A as the semiconductor chip, the interface chip 7, although it is from a different wafer, also has a similar rear surface chipping-prevention groove 5A.

The upper surface of the uppermost layer memory chip 1Aa is covered by an NCF (non-conductive film) 83 and a lead frame 84. The chip laminate has a first sealing resin part 81 made of, for example, an underfilling material. The first sealing resin part 81 fills into the gaps between each of the semiconductor chips, and forms a tapered shape at both sides of the chip laminate. A second sealing resin layer 82 that covers the chip laminate is formed on one surface of the interconnect substrate 6.

The front surface bump electrodes 25 on one surface (the bottom surface in FIG. 6) of the lowermost semiconductor chip of the chip laminate are connected to the connection pads 63 of the interconnect substrate 6 via wire bumps.

Solder balls 85 that will serve as external terminals of the semiconductor package are placed on the plurality of lands 64 on the other surface of the interconnect substrate 6, and the external terminals are disposed in a matrix arrangement with a prescribed spacing.

In a memory chip 1A according to the first embodiment as described above, because a rear surface chipping-prevention groove 5A is provided in the guard ring area GA on the rear surface side, chipping of the rear surface side that can occur in the dicing process step can be prevented from intruding into the active area AA. Accompanying this, the rear surface outer appearance inspection yield after dicing is improved. Additionally, it is possible to minimize the scribing area SA, thereby enabling a reduction of the overall chip size and, as a result, enabling an increase in the effective number of chips obtained per wafer.

Second Embodiment

Figure 7:
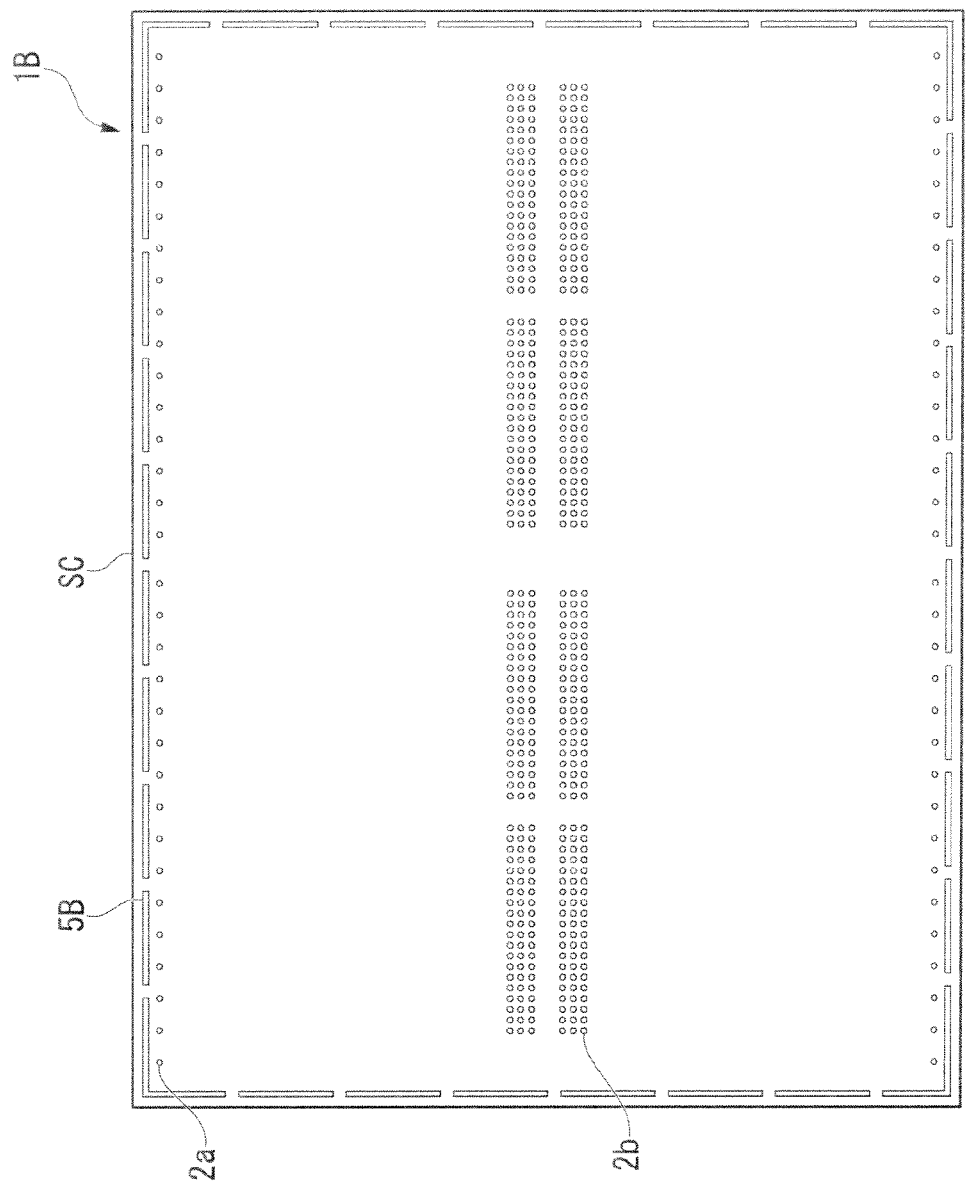
FIG. 7 is a plan view of a memory chip in accordance with a second embodiment of the present invention.

A memory chip (DRAM) according to a second embodiment in a semiconductor chip of the present invention will be described. FIG. 7 is a schematic plan view representation of a memory chip (DRAM) according to the second embodiment in a semiconductor chip of the present invention, seen from the rear surface side.

Whereas in the memory chip 1A of the first embodiment, as shown in FIG. 1, the rear surface chipping-prevention groove 5A is formed as a closed curve that surrounds the support through electrodes 2a, a feature of the present second embodiment is the provision in the memory chip 1B, as shown in FIG. 7, of an interrupted rear surface chipping-prevention groove 5B.

The through electrodes 2, as shown in the method for manufacturing the chip of the first embodiment, are sometimes formed by electroplating, using a seed film. In such a case, if the entire periphery of the chip is surrounded by the groove such as shown in the first embodiment in FIG. 1, because the coverage of the seed film in the groove part is poor, there are times when there are opens in the seed film within the groove part, so that it is not possible to cause the flow of sufficient current within the chip required for electroplating. Given this, by providing the groove in an interrupted manner, flat parts remain in parts in which there is no groove formed in the chip periphery edge, that is, in the flat parts between grooves, so that even if the seed film coverage in the groove part is poor, the seed film is reliably formed in the flat parts. The result is that, when electroplating is done it is possible to cause current to flow via the seed film in the flat parts up to the through hole parts within the chip. A supplementary reason for doing this is to suppress a decrease in the bending strength of the chip by the presence of the groove.

The other aspects of the constitution of and method for manufacturing the chip, and the constitution of the semiconductor package that includes the chip are the same as in the first embodiment.

Third Embodiment

Figure 8:
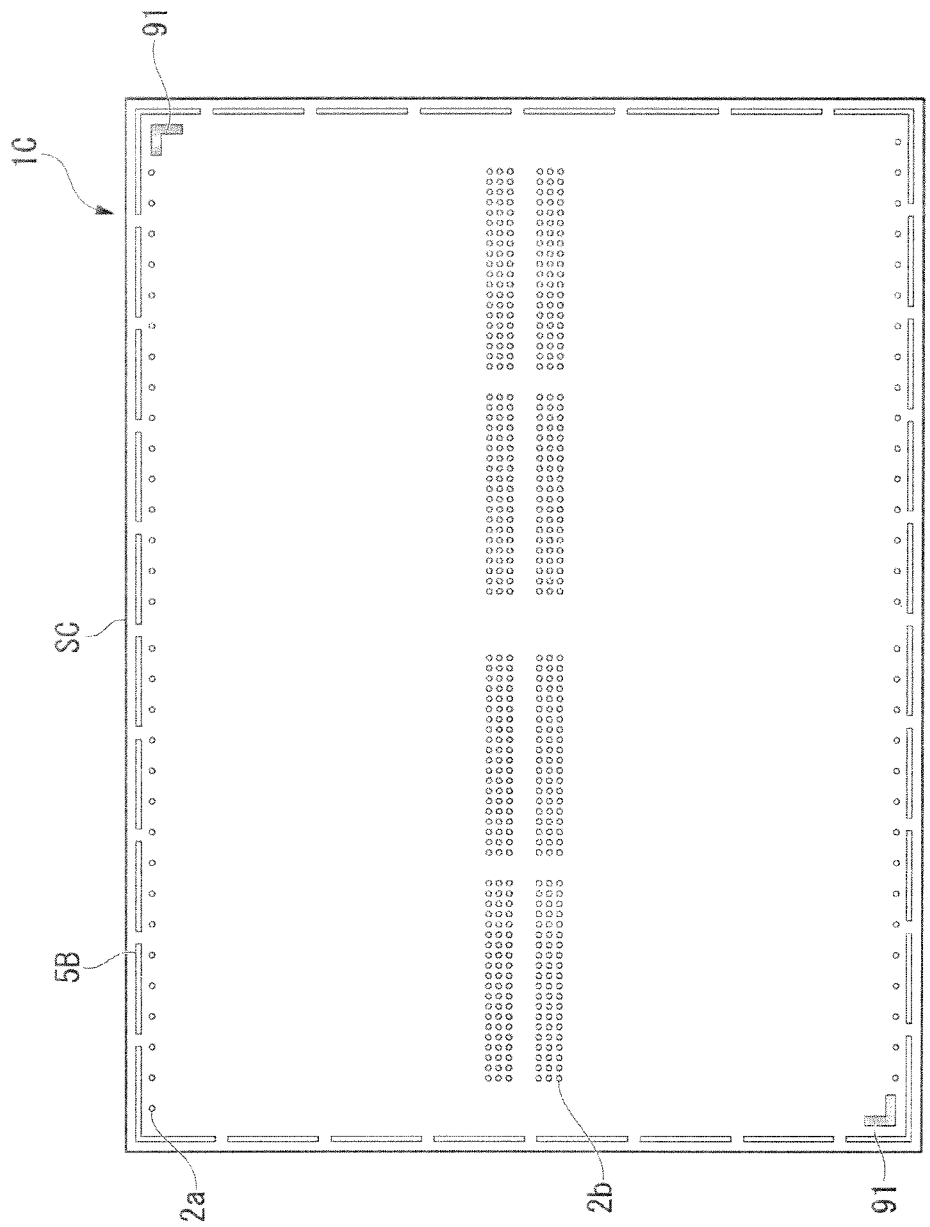
FIG. 8 is a plan view of a memory chip in accordance with a third embodiment of the present invention.

A memory chip (DRAM) according to a third embodiment in the semiconductor chip of the present invention will be described. FIG. 8 is a schematic plan view representation of a memory chip (DRAM) according to the third embodiment in the semiconductor chip of the present invention, seen from the rear surface side.

In a memory chip IC of the present third embodiment, as shown in FIG. 8, shallow grooves that are flip-chip bonder alignment marks 91 are provided at each of a pair of chip corner parts positioned at diagonally opposing corners. These alignment marks 91 enable accurate formation of the chip laminate in the semiconductor package shown in FIG. 6. Although the alignment marks 91 are shown as L shapes as an example, this is not a restriction, and other shapes, for example, crosses, squares, or the like may be used, as long as flip-chip bonder recognition is possible.

The other aspects of the constitution of and method for manufacturing the chip, and the constitution of the semiconductor package that includes the chip are the same as in the first embodiment.

Also, although FIG. 8 shows an example in which the alignment marks 91 are provided in the rear surface chipping-prevention grooves 5B that was shown in the second embodiment, the alignment marks may be provided in the groove shown in the first embodiment, and also in the grooves shown below in the following embodiments.

Fourth Embodiment

Figure 9:
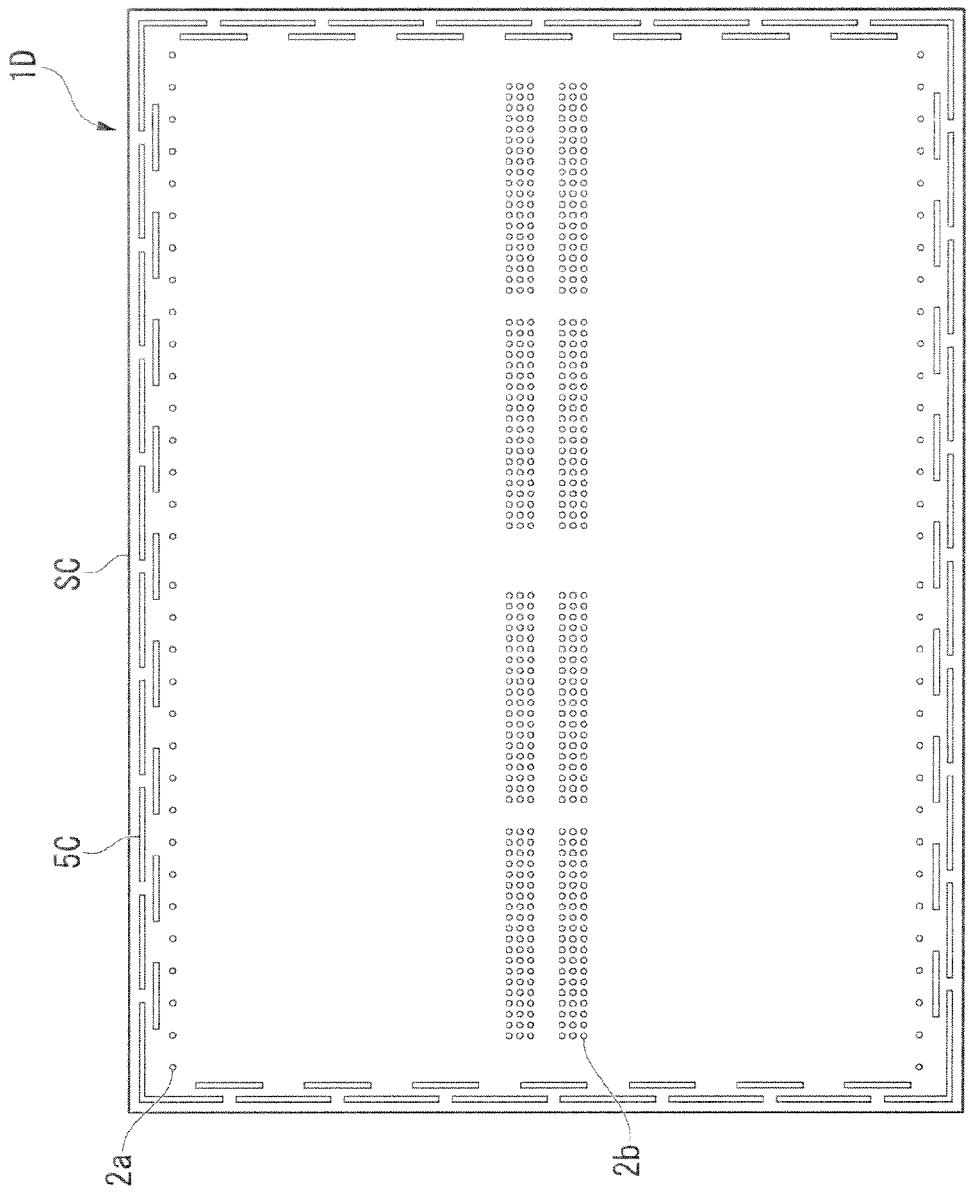
FIG. 9 is a plan view of a memory chip in accordance with a fourth embodiment of the present invention.

A memory chip (DRAM) according to a fourth embodiment in the semiconductor chip of the present invention will be described. FIG. 9 is a schematic plan view representation of a memory chip (DRAM) according to the fourth embodiment in the semiconductor chip of the present invention, seen from the rear surface side.

In a memory chip ID of the present fourth embodiment, in addition to the interrupted rear surface chipping-prevention groove 5B of the memory chip 1B in the second embodiment shown in FIG. 7, an interrupted groove is provided further to the inside thereof, the entirety being formed as a rear surface chipping-prevention groove 5C. When this is done, it is important that the constitution be such that the missing parts in the inside groove and the outside groove do not overlap with one another. By adopting this constitution, a double effect can be expected, this being the effect of the constitution of the second embodiment, that is, the effect of reliable flow of current, and the effect of preventing the intrusion of rear surface chipping into the inside from the missing parts.

The other aspects of the constitution of and method for manufacturing the chip, and the constitution of the semiconductor package that includes the chip are the same as in the first embodiment.

Fifth Embodiment

Figure 10:
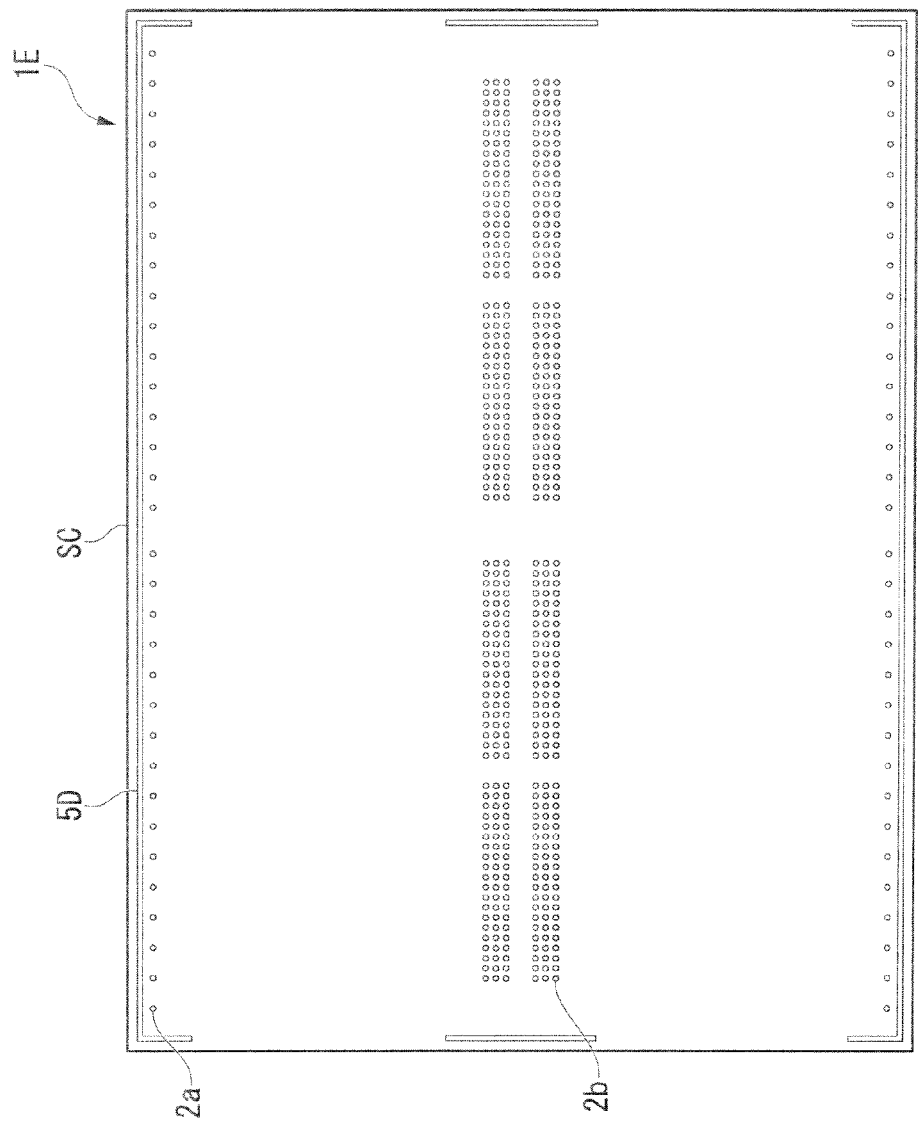
FIG. 10 is a plan view of a memory chip in accordance with a fifth embodiment of the present invention.

A memory chip (DRAM) according to a fifth embodiment in the semiconductor chip of the present invention will be described. FIG. 10 is a schematic plan view representation of a memory chip (DRAM) according to the fifth embodiment in the semiconductor chip of the present invention, seen from the rear surface side.

Although in the memory chip 1A of the first embodiment, as shown in FIG. 1, a groove is formed around the entire periphery of the chip, in the memory chip 1E of the present fifth embodiment, a rear surface chipping-prevention groove 5D is provided only in the part between chip periphery in the part in which the support through electrodes 2a are formed and the support through electrodes 2a.

By the above-noted constitution, similar to the case of the second embodiment, it is possible both to avoid the problem of seed film coverage and to ensure strength. Although there is a possibility that long rear surface chipping will intrude to within the chip in the part having no grooves, because there is no structure in that part that should be protected, this is not a problem.

The other aspects of the constitution of and method for manufacturing the chip, and the constitution of the semiconductor package that includes the chip are the same as in the first embodiment.

Sixth Embodiment

Figure 11:
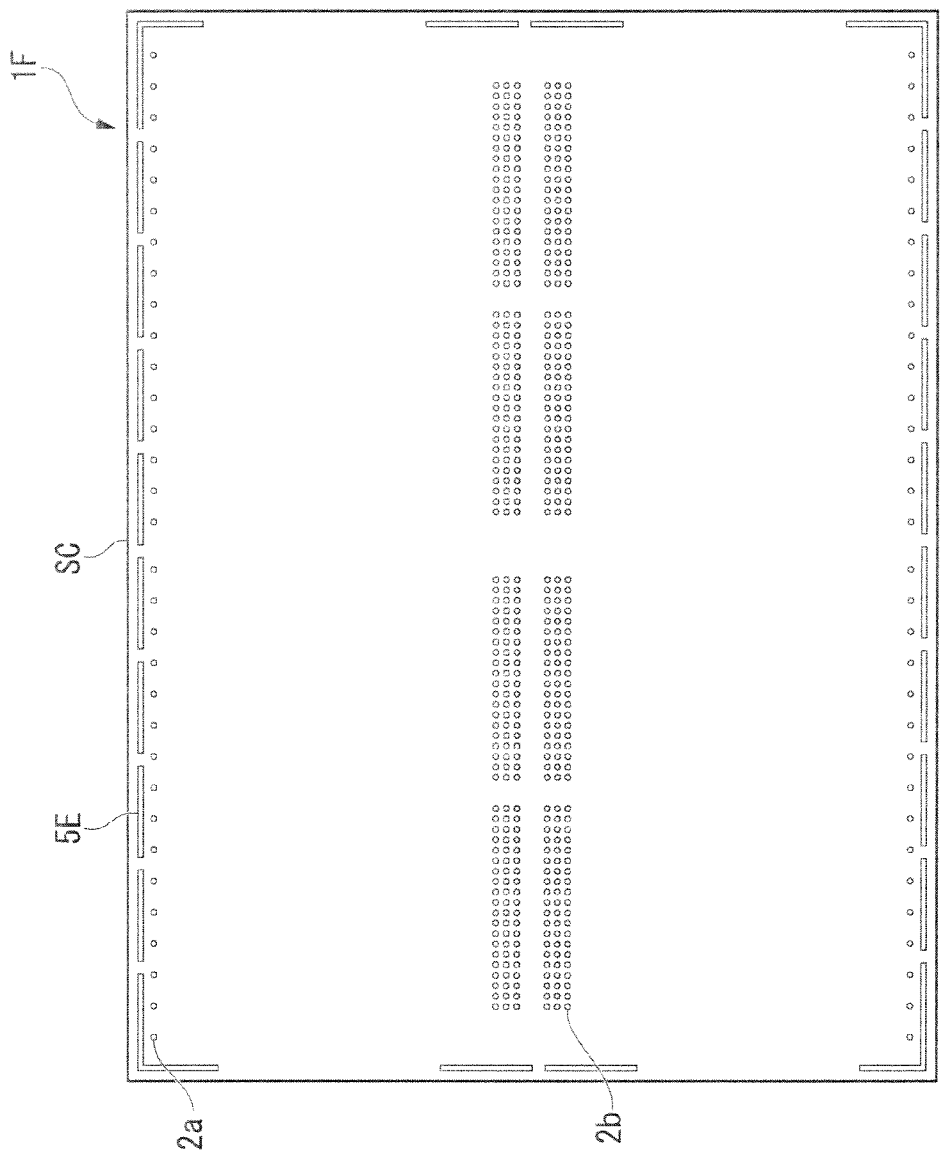
FIG. 11 is a plan view of a memory chip in accordance with a sixth embodiment of the present invention.

A memory chip (DRAM) according to a sixth embodiment in the semiconductor chip of the present invention will be described. FIG. 11 is a schematic plan view representation of a memory chip (DRAM) according to the sixth embodiment in the semiconductor chip of the present invention, seen from the rear surface side.

A memory chip 1F according to the present sixth embodiment has a rear surface chipping-prevention groove 5E that is a combination of the grooves of the fifth embodiment and the second embodiment.

The other aspects of the constitution of and method for manufacturing the chip, and the constitution of the semiconductor package that includes the chip are the same as in the first embodiment.

Seventh Embodiment

Figure 12:
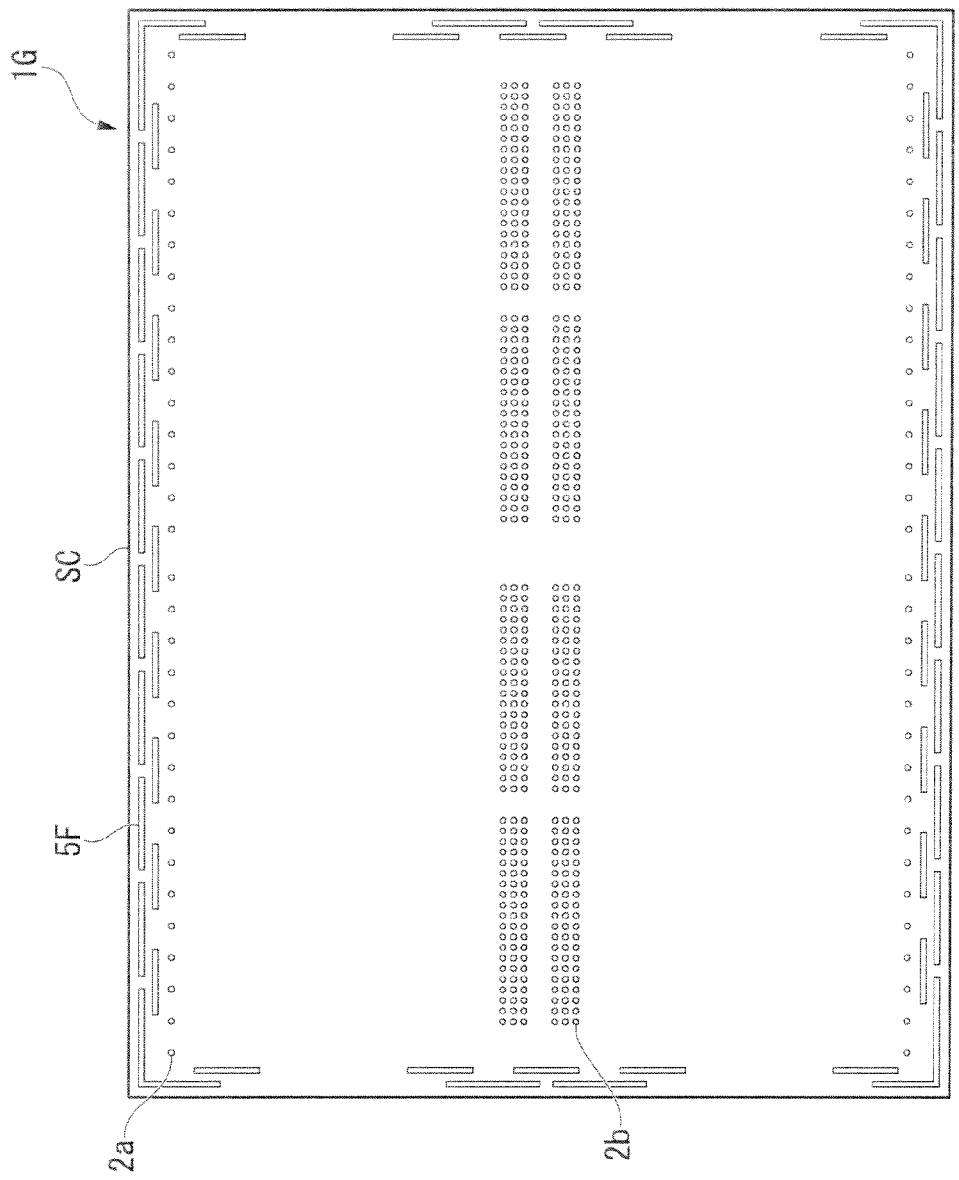
FIG. 12 is a plan view of a memory chip in accordance with a seventh embodiment of the present invention.

A memory chip (DRAM) according to a seventh embodiment in the semiconductor chip of the present invention will be described. FIG. 12 is a schematic plan view representation of a memory chip (DRAM) according to the seventh embodiment in the semiconductor chip of the present invention, seen from the rear surface side.

A memory chip 1G according to the present seventh embodiment has a rear surface chipping-prevention groove 5F that is a combination of the grooves of the fifth embodiment and the fourth embodiment.

The other aspects of the constitution of and method for manufacturing the chip, and the constitution of the semiconductor package that includes the chip are the same as in the first embodiment.

Eight Embodiment

Figure 13:
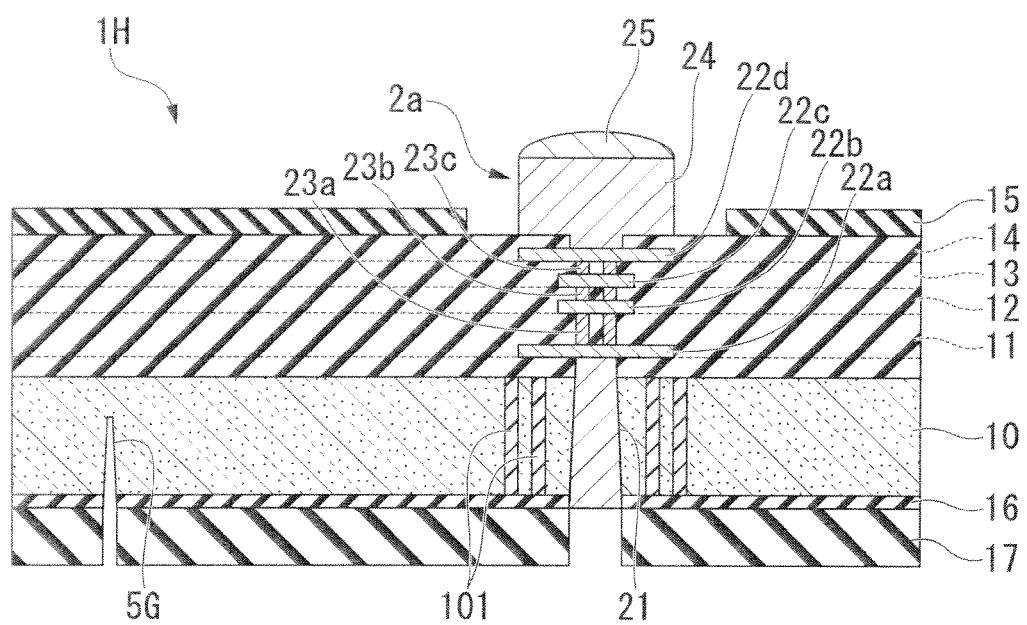
FIG. 13 is a plan view of a memory chip in accordance with an eighth embodiment of the present invention.

A memory chip (DRAM) according to an eighth embodiment in the semiconductor chip of the present invention will be described. FIG. 13 and FIG. 14 are drawings for describing the memory chip (DRAM) according to the eighth embodiment in the semiconductor chip of the present invention.

According to the method of manufacturing a memory chip according to the first embodiment, which was shown in FIG. 4, there is the problem of adding one mask, and of an increase in the number of process steps (step S107 to step S111). As a method of dealing with the drawback of an increase in the number of process steps, there is the method of forming the rear surface chipping-prevention groove simultaneously in the step of dry etching the through hole part 21. With fabrication by this method, however, it is necessary to use the following slight refinement. Specifically, because the through hole part 21 is made by a process step that forms a deep hole that passes through the semiconductor substrate 10, if formation is done so as to have an aperture that is a similar size as the through hole part in the rear surface chipping-prevention groove, an unnecessarily deep groove is formed, and there is a risk of breakage of the wafer during processing.

From this standpoint, in the process step of dry etching the through hole part 21, in the method for simultaneously forming the rear surface chipping-prevention groove, as shown in FIG. 13, the aperture in the resist 17 corresponding to the rear surface chipping-prevention groove 5G is made the shape of a dot, with the surface area thereof being made smaller than that of the corresponding through hole part 21. By doing this, by the microloading effect, the rear surface chipping-prevention groove 5G is made shallower than the through hole part 21.

Figure 14A:
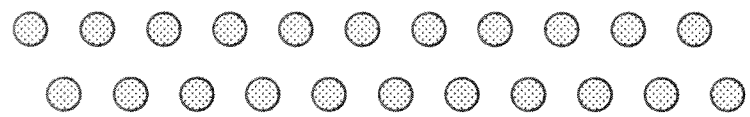
FIG. 14 is a view of patterns of grooves of the memory chip of FIG. 13.
Figure 14B:
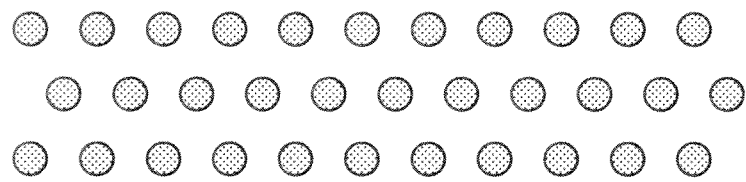
Figure 14C:
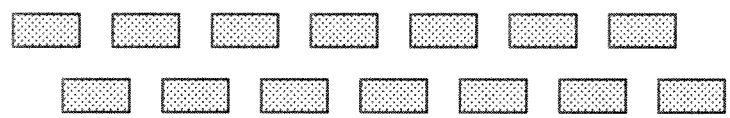
Figure 14D:
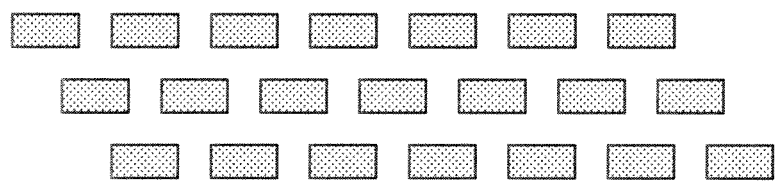

With respect to the groove aperture becoming smaller and a reduction in the chipping prevention effect, a plurality of apertures are provided to restore the effect. FIG. 14 is a drawing showing examples of the patterns thereof. FIG. 14A shows the case of providing two rows of circularly shaped apertures, and FIG. 14B shows the example of providing three rows thereof. FIG. 14C shows the case of providing two rows of rectangular-shaped apertures, and FIG. 14D shows the case of providing three rows thereof. Of course, four or more rows may be provided.

In FIG. 13, other aspects of the constitution of the memory chip iH are the same as in the first embodiment.

Although the foregoing descriptions of embodiments have been for the case of a memory chip, and specifically a DRAM, as the semiconductor chip, this is not a restriction, and the semiconductor chip may be another type of semiconductor memory, such as, for example, an SRAM, a PRAM, or a flash memory. Additionally, there is no need for the semiconductor chip to be a memory chip, and it may be an interface chip that forms one part of the above-described semiconductor package.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

Furthermore, the particular features, structures, or characteristics may be combined in any suitable manner in one or more embodiments.

The terms of degree such as "substantially," "about," and "approximately" as used herein mean a reasonable amount of deviation of the modified term such that the end result is not significantly changed. For example, these terms can be construed as including a deviation of at least ±5 percents of the modified term f this deviation would not negate the meaning of the word it modifies.

It is apparent that the present invention is not limited to the above embodiments, but may be modified and changed without departing from the scope and spirit of the invention.

What is claimed is:

1. A semiconductor device comprising:
    a semiconductor substrate;
    a through electrode that penetrates the semiconductor substrate;
    an inter-layer insulator formed on a first surface of the semiconductor substrate; and
    a guard ring formed in the inter-layer insulator,
    wherein the semiconductor substrate includes a groove structure that is formed in a second surface of the substrate and positioned between a peripheral edge of the semiconductor substrate and the through electrode, the guard ring at least partially overlapping the groove structure in a first direction that is perpendicular to the second surface of the semiconductor substrate.

2. The semiconductor device according to claim 1, further comprising:
    a multi-level interconnect structure provided in the inter-layer insulator, the multi-level interconnect structure including first and second interconnects and a first contact plug coupling the first interconnect to the second interconnect,
    wherein the second surface opposes the first surface of the semiconductor substrate and an end of the through electrode is coupled to the first interconnect.

3. The semiconductor device according to claim 2, further comprising:
    a first electrode provided on the multi-level interconnect structure,
    wherein the multi-level interconnect structure further includes a third interconnect which is electrically connected to the second interconnect, and the first electrode is coupled to the third interconnect.

4. The semiconductor device according to claim 3, further comprising:
    a second electrode mounted on the second surface of the semiconductor substrate, the second electrode being coupled to the other end of the through electrode so that the first electrode is electrically connected to the second electrode through the multi-level interconnect structure and the through electrode.

5. The semiconductor device according to claim 1, wherein the semiconductor substrate has at least an alignment mark, and the groove structure is positioned between the alignment mark and the peripheral edge of the semiconductor substrate.

6. The semiconductor device according to claim 1, wherein the groove structure does not penetrate the semiconductor substrate.

7. A semiconductor device comprising:
    a semiconductor substrate;
    a through electrode that penetrates the semiconductor substrate, the semiconductor substrate including a groove structure that is positioned between a peripheral edge of the semiconductor substrate and the through electrode;
    an inter-layer insulator mounted on a first surface of the semiconductor substrate;
    a multi-level interconnect structure provided in the inter-layer insulator, the multi-level interconnect structure including first and second interconnects and a first contact plug coupling the first interconnect to the second interconnect, the groove structure being formed in a second surface opposing to the first surface of the semiconductor substrate and an end of the through electrode being coupled to the first interconnect; and
    a guard ring structure provided in the inter-layer insulator, the guard ring structure including third and fourth interconnects and a second contact plug coupling to the third interconnect to the fourth interconnect, the guard ring being located between the multi-level interconnect structure and a peripheral edge of the inter-layer insulator, the peripheral edge of the inter-layer insulator being approximately vertically aligned with the peripheral edge of the semiconductor substrate.

8. The semiconductor device according to claim 7, wherein the guard ring structure at least partially overlaps the groove structure in plan view.

9. The semiconductor device according to claim 8, further comprising:
    a crack stopper structure provided in the inter-layer insulator, the crack stopper structure including fifth and sixth interconnects and a third contact plug coupling to the fifth interconnect to the sixth interconnects, the crack stopper being located between the guard ring structure and the peripheral edge of the inter-layer insulator.

10. A semiconductor device comprising:
    a wiring board; and
    a plurality of semiconductor chips stacked over the wiring board,
    wherein each of the plurality of semiconductor chips comprises:
        a semiconductor substrate having first and second surfaces opposing to each other;
        an inter-layer insulator on the first surface of the semiconductor substrate;
        a guard ring structure formed in the inter-layer insulator;
        a plurality of interconnects in the inter-layer insulator; and
        a plurality of through electrodes that penetrate the semiconductor substrate, the through electrode coupled to the plurality of interconnects, respectively,
    wherein the semiconductor substrate includes has a groove structure in the second surface, the groove structure is positioned between a peripheral edge of the semiconductor substrate and the plurality of through electrodes, and the guard ring structure at least partially overlaps the groove structure in a first direction that is perpendicular to the second surface of the semiconductor substrate.

11. The semiconductor device according to claim 10, wherein each of the semiconductor chips further comprises:
    a crack stopper structure in a crack stopper area of the inter-layer insulator, the crack stopper area being defined between the groove structure and the peripheral edge of the substrate structure, wherein the guard ring structure is formed in a guard ring area of the inter-layer insulator, the guard ring area being defined between the crack stopper area and an active area, the active area having the plurality of through electrodes, wherein the groove structure is disposed in the second surface and in the guard ring area.

12. A semiconductor device comprising:
a semiconductor substrate including first and second surface portions opposing to each other;
an inter-layer insulator formed on a first surface portion of the semiconductor substrate;
a guard ring formed in the inter-layer insulator;
a plurality of through electrodes each penetrating the semiconductor substrate;
a plurality of circuit elements formed in the first surface portion; and
a groove formed in the second surface portion without penetrating the semiconductor substrate, the guard ring at least partially overlapping the groove in a first direction that is perpendicular to the second surface portion of the semiconductor substrate.

13. The semiconductor device according to claim 12, wherein the semiconductor substrate includes a central portion and a peripheral portion surrounding the central portion, the central portion being defined by central areas of the first and second surface portions, the groove of the semiconductor substrate being included in the peripheral portion, and the through electrodes and the circuit elements being included in the central portion.

14. The semiconductor device according to claim 13, wherein the semiconductor substrate further includes a plurality of side surface portions, and the groove being formed along the side surface portions and surrounding the central portion.

15. The semiconductor device according to claim 13, further comprising:
a plurality of additional grooves each formed in the second surface portion without penetrating the semiconductor substrate, the additional grooves being included in the peripheral portion.

16. The semiconductor device according to claim 13, further comprising:
a plurality of additional through electrodes each penetrating the semiconductor substrate, the additional through electrodes being included in the peripheral portion, wherein the semiconductor substrate further includes a plurality of side surface portions and the groove being located between one of the side surface portions and at least one of the additional through electrodes.

17. The semiconductor device according to claim 12, wherein the semiconductor substrate further includes a plurality of side surface portions and the groove being located between one of the side surface portions and at least one of the through electrodes.

18. The semiconductor device according to claim 16, wherein the groove is formed along the one of the side surface portions and the additional through electrodes being arranged along the one of the side surface portions.

19. The semiconductor device according to claim 16, wherein the additional through electrodes are configured to have a common potential and each of the through electrodes are electrically connected to a corresponding one of the circuit elements.

20. The semiconductor device according to claim 12, wherein a depth of the groove is less than half of a thickness of the semiconductor substrate.

* * * * *